(12) United States Patent
Bi et al.

(10) Patent No.: US 10,236,346 B1
(45) Date of Patent: Mar. 19, 2019

(54) TRANSISTOR HAVING A HIGH GERMANIUM PERCENTAGE FIN CHANNEL AND A GRADIENT SOURCE/DRAIN JUNCTION DOPING PROFILE

(71) Applicant: International Business Machines Corporation, Armonk, NY (US)

(72) Inventors: Zhenxing Bi, Niskayuna, NY (US); Kangguo Cheng, Schenectady, NY (US); Peng Xu, Sunnyvale, CA (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/793,195

(22) Filed: Oct. 25, 2017

(51) Int. Cl.
| | |
|---|---|
| *H01L 29/10* | (2006.01) |
| *H01L 21/8234* | (2006.01) |
| *H01L 29/08* | (2006.01) |
| *H01L 29/78* | (2006.01) |
| *H01L 29/66* | (2006.01) |
| *H01L 27/088* | (2006.01) |

(52) U.S. Cl.
CPC .. *H01L 29/1083* (2013.01); *H01L 21/823412* (2013.01); *H01L 21/823456* (2013.01); *H01L 21/823468* (2013.01); *H01L 21/823487* (2013.01); *H01L 27/0886* (2013.01); *H01L 29/0873* (2013.01); *H01L 29/66795* (2013.01); *H01L 29/7827* (2013.01)

(58) Field of Classification Search
CPC ................. H01L 29/782; H01L 21/823487
See application file for complete search history.

(56) References Cited

U.S. PATENT DOCUMENTS

| | | | |
|---|---|---|---|
| 4,617,066 A | 10/1986 | Vasudev | |
| 7,993,999 B2 | 8/2011 | Basker et al. | |
| 8,384,065 B2 | 2/2013 | Bangsaruntip et al. | |
| 8,691,650 B2 | 4/2014 | Cheng et al. | |
| 9,064,893 B2 | 6/2015 | Liao et al. | |
| 9,257,556 B2 | 2/2016 | Xu et al. | |
| 9,406,529 B1 | 8/2016 | Chan et al. | |
| 9,431,305 B1 | 8/2016 | Anderson et al. | |
| 9,455,331 B1* | 9/2016 | Cai | ............. H01L 29/6656 |
| 9,525,027 B2 | 12/2016 | Hashemi et al. | |
| 9,627,511 B1* | 4/2017 | Cheng | ............. H01L 29/66553 |
| 9,728,542 B1* | 8/2017 | Balakrishnan | .... H01L 27/11206 |
| 2012/0261754 A1 | 10/2012 | Cheng et al. | |
| 2017/0053912 A1 | 2/2017 | Ching et al. | |
| 2018/0053840 A1* | 2/2018 | Mallela | ............. H01L 29/1033 |

\* cited by examiner

*Primary Examiner* — Dung A. Le

(74) *Attorney, Agent, or Firm* — Cantor Colburn LLP; Vazken Alexanian

(57) ABSTRACT

Embodiments of the invention are directed to a method of forming a semiconductor device. A non-limiting example method includes forming a fin channel over a bottom source-or-drain (S/D) region, wherein the fin channel includes an upper fin channel region and a lower fin channel region, and wherein the bottom S/D region includes an upper S/D region and a lower S/D region. The method further includes forming a S/D junction at an interface between the lower fin channel region and the upper S/D region. A doping process is applied. The doping process is configured to drive a first type of dopant into the upper fin channel region.

13 Claims, 8 Drawing Sheets

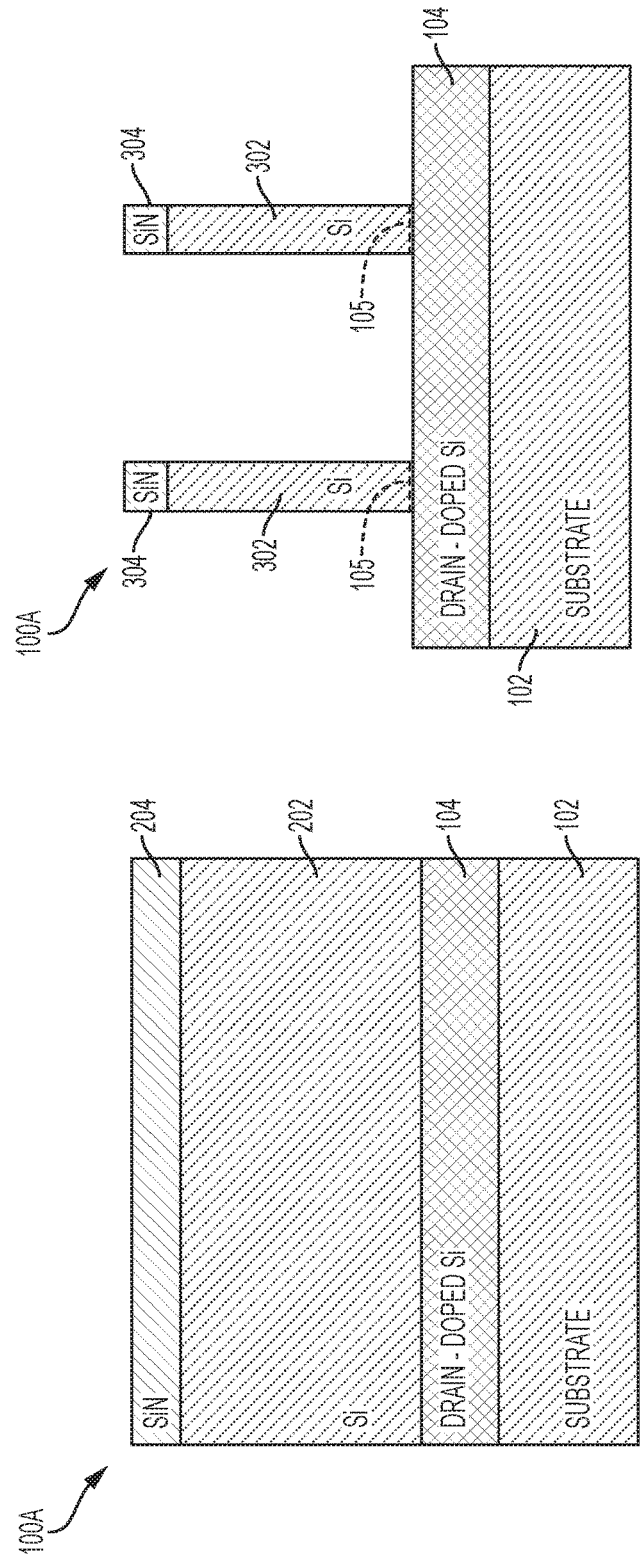

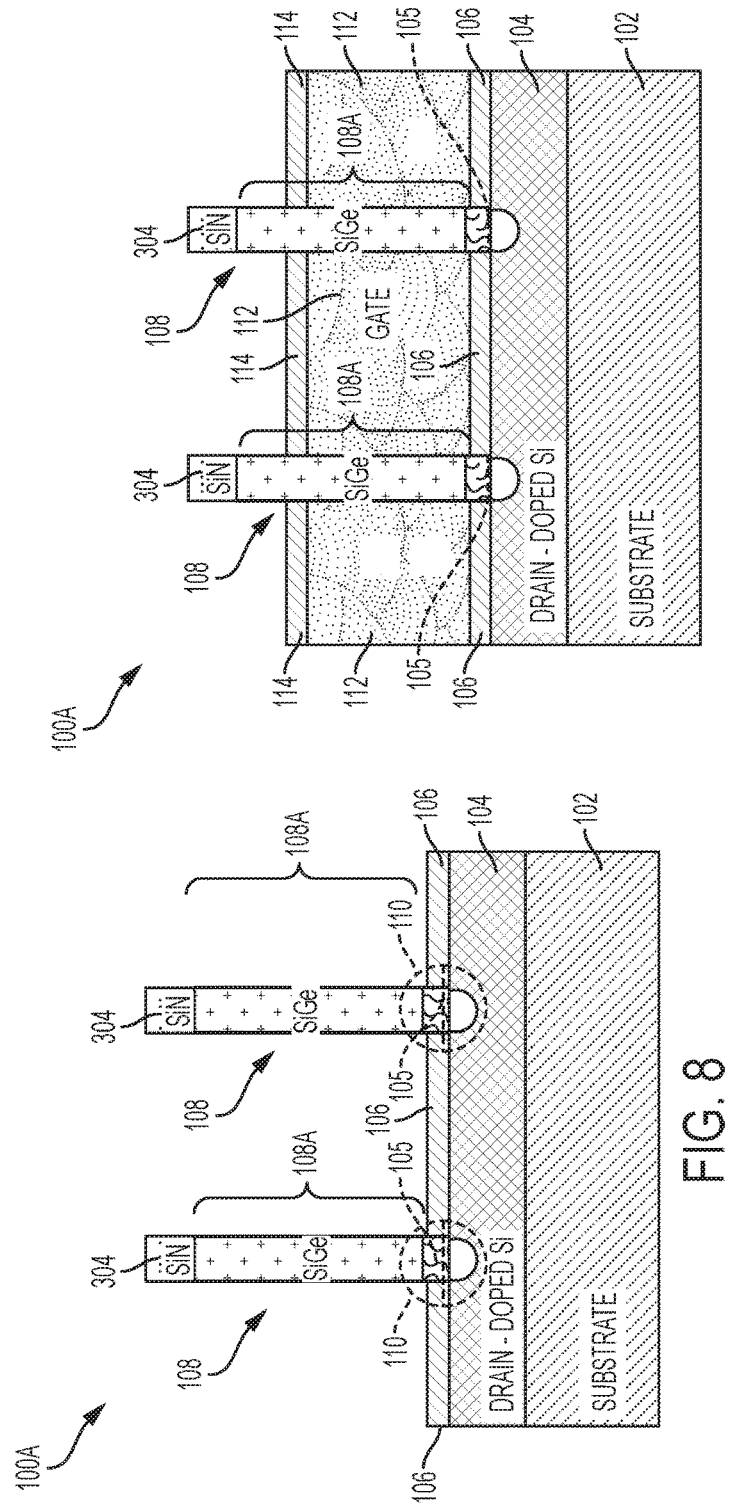

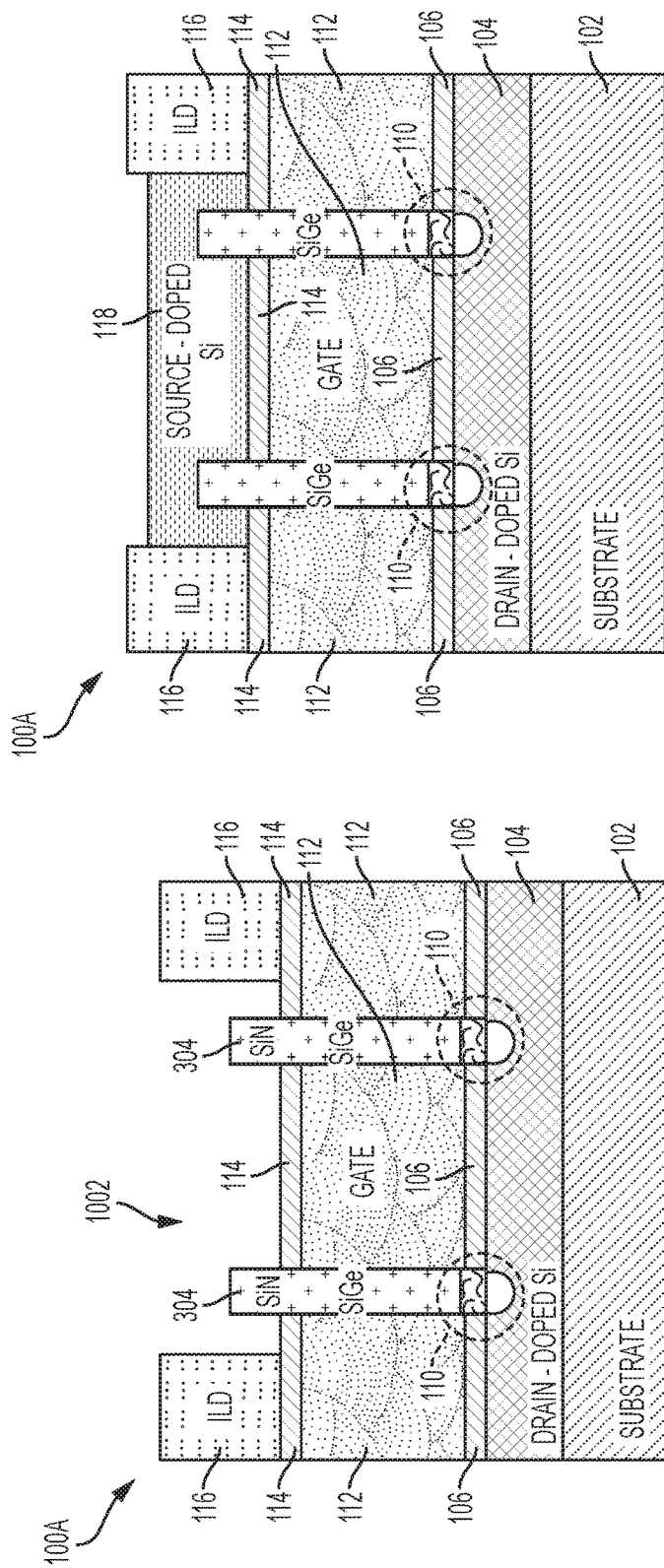

US 10,236,346 B1

TRANSISTOR HAVING A HIGH GERMANIUM PERCENTAGE FIN CHANNEL AND A GRADIENT SOURCE/DRAIN JUNCTION DOPING PROFILE

BACKGROUND

The present invention relates in general to semiconductor devices and their fabrication. More specifically, the present invention relates to improved fabrication methodologies and resulting structures for a vertical field effect transistor (VFET) having a relatively high percentage of germanium in its fin channel, along with a decreasing-gradient doping profile across its source/drain (S/D) junction(s) to improve gate-induced-drain-leakage (GIDL) current performance.

In an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. The term "planar" is often used to describe a conventional geometry for MOSTFETs in which the various component parts of the MOSFET device are laid down as planes or layers.

VFETs are one example of a non-planar MOSFET geometry. VFETs employ semiconductor fins and side-gates that can be contacted outside the active region, resulting in increased device density and some increased performance over planar/lateral devices. In VFETs, the source-to-drain current flows in a direction that is perpendicular to a major surface of the substrate. The fin forms the channel region of the VFET. A source region and a drain region are in electrical contact with the top and bottom ends of the channel region, and a gate is disposed on sidewalls of the fins. An important performance parameter in designing VFETs is minimizing the presence of off-state leakage currents such as GIDL current.

SUMMARY

Embodiments of the invention are directed to a method of forming a semiconductor device. A non-limiting example method includes forming a fin channel over a bottom source-or-drain (S/D) region, wherein the fin channel includes an upper fin channel region and a lower fin channel region, and wherein the bottom S/D region includes an upper S/D region and a lower S/D region. The method further includes forming a S/D junction at an interface between the lower fin channel region and the upper S/D region. A doping process is applied. The doping process is configured to drive a first type of dopant into the upper fin channel region.

Embodiments of the invention are directed to a method of forming a semiconductor device. A non-limiting example method includes forming a fin channel over a bottom S/D region, wherein the fin channel includes an upper fin channel region and a lower fin channel region, and wherein the bottom S/D region includes an upper S/D region and a lower S/D region. The method further includes forming a S/D junction at an interface between the lower fin channel region and the upper S/D region. A doping process is applied. The doping process is configured to drive a first type of dopant into the upper fin channel region. The doping process is also configured to diffuse the first type of dopants into the lower fin channel region, across the S/D junction, and into the upper S/D region.

Embodiments of the invention are directed to a semiconductor device. A non-limiting example of the semiconductor device includes a fin channel formed over a bottom S/D region, wherein the fin channel includes an upper fin channel region and a lower fin channel region, and wherein the bottom S/D region includes an upper S/D region and a lower S/D region. A S/D junction is formed at an interface between the lower fin channel region and the upper S/D region, wherein the upper fin channel region includes a first type of dopant, wherein the lower fin channel region includes the first type of dopant, wherein the upper S/D region includes the first type of dopant, and wherein a percentage of the first type of dopant in the upper fin channel region is greater than a percentage of the first type of dopant in the upper S/D region.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIG. 2 depicts a cross-sectional view of a semiconductor structure after a fabrication operation according to embodiments of the invention;

FIG. 3 depicts a cross-sectional view of the semiconductor structure after a fabrication operation according to embodiments of the invention;

FIG. 8 depicts a cross-sectional view of the semiconductor structure after a fabrication operation according to embodiments of the invention;

FIG. 9 depicts a cross-sectional view of the semiconductor structure after a fabrication operation according to embodiments of the invention;

FIG. 10 depicts a cross-sectional view of the semiconductor structure after a fabrication operation according to embodiments of the invention;

FIG. 11 depicts a cross-sectional view of the semiconductor structure after a fabrication operation according to embodiments of the invention;

Figure 1B:
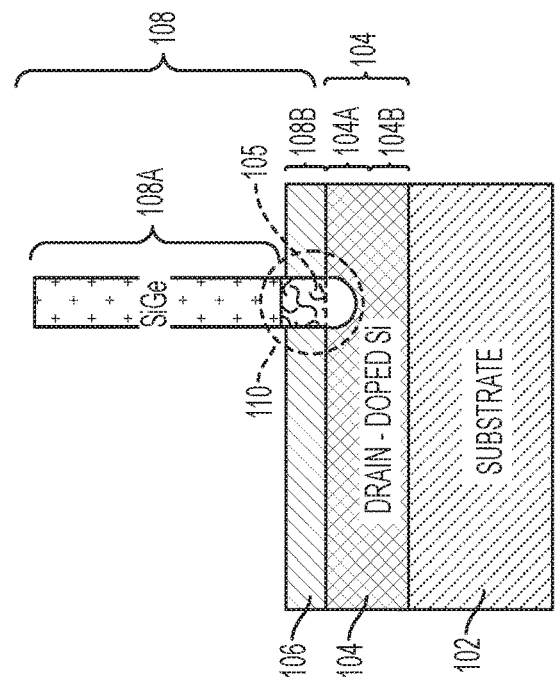
FIG. 1B depicts an isolated view of the channel fin and source/drain (S/D) junction region of the VFET structure shown in FIG. 1A.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although the examples provided in this written description focus on fabrication operations and resulting structures for a specific type of VFET, implementation of the teachings recited herein are not limited to a particular type of VFET or IC architecture. Rather embodiments of the present invention are capable of being implemented in conjunction with any other type of VFET or IC architecture, now known or later developed. Additionally, although the examples provided in this written description focus on a VFET structure having a silicon substrate and silicon germanium fin channels, the teachings can be utilized with other semiconductor materials and combinations of semiconductor materials. Additionally, although examples of the invention provided herein focus on the doping profile across the VFET drain junction, the teachings apply equally to the source junction when the VFET is configured to provide the source junction in the lower region of the VFET.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, may or may not be used herein for ease of description to describe one element or feature's relationship to another element(s) or feature(s) as illustrated in the figures. Persons skilled in the art will understand that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

Turning now to an overview of technologies that are more specifically relevant to aspects of the present invention, the use of silicon germanium to form elements (e.g., the fin channels) of a FET device (e.g., a VFET) provides desirable device characteristics. For example, the presence of germanium in the silicon germanium elements introduces strain in the element, which enhances carrier mobility and overall transistor performance. The compressive strain (typically expressed as a percentage) introduced by using silicon germanium in the active region (e.g., the fin channels of a VFET) is based on the concentration of germanium introduced into the silicon. For example, a silicon germanium channel fin (e.g., the channel fin 108) having a 25% concentration of germanium can exhibit a nominal compressive strain of 0.01 (or 1%) with a +/−5% variation. Accordingly, many applications benefit from designing the fin channels of its VFET components to include a relatively high percentage of germanium (e.g., above about 50%).

However, providing a relatively high percentage of germanium in the silicon germanium fins of a VFET device can have a negative impact on the ability to suppress off-state leakage currents such as gate-induced-drain-leakage (GIDL) current. GIDL is caused by a relatively high gate to drain voltage difference generating electron-hole pairs in the overlap region of the gate and the drain. In GIDL, a leakage current is established between the drain and the bulk (i.e., body) of the FET.

As FET devices with smaller and smaller feature sizes have been developed, the ratio of leakage to operating current increases. At the same time, the trend into mobile applications requires a minimum power loss to support long battery life. For low-power applications, $I_{min}$ is an important performance parameter. Accordingly, because off-state leakage currents such as GIDL waste power, it is desirable to keep such leakage currents as low as possible, or to eliminate them altogether. In known FET device configurations, attempts to reduce GIDL currents focus on manipulating oxide thickness and the gate-to-drain voltage difference.

Turning now to an overview of aspects of the invention, embodiments of the invention provide improved fabrication methodologies and resulting structures for a VFET device having a relatively high percentage of germanium (e.g., above about 50%) in its fin channel, and also having a decreasing-gradient doping profile across its drain junction(s). As used herein, the term "gradient" refers to an increase or decrease in the magnitude of a property (e.g., temperature, pressure, or concentration) observed in passing from one point or moment to another. The high percentage of germanium in the fin channel can provide desirable device characteristics, including, for example, the introduction of strain in the silicon germanium element to enhance carrier mobility, which enhances transistor performance. The decreasing-gradient doping profile across the drain junction improves GIDL current performance. Embodiments of the invention allow both conditions (high germanium percentage in the fin channel; and decreasing-gradient doping profile across the drain junction) to be provided in the same VFET device.

In embodiments of the invention, the relatively high percentage of germanium in the fin channel can be achieved by forming a silicon fin channel over a drain region of a VFET device, and by forming at least one silicon germanium region, which has a predetermined percentage of germanium, along at least one sidewall of the fin channel. In embodiments of the invention, the silicon germanium region(s) are epitaxially grown along the sidewall(s) of the fin channel to form diamond-shaped silicon germanium regions. An anneal operation is applied to the fin channel, which drives germanium laterally from the silicon germanium region(s) into the silicon fin channel. In addition to driving germanium laterally from the silicon germanium region(s) into the silicon fin channel, the anneal operation also results in germanium diffusing into a lower fin region of the fin channel in a manner that creates a decreasing-gradient germanium doping profile across the drain junction formed between the silicon germanium fin channel and the drain.

Embodiments of the invention leverage the observation that GIDL current is closely related to the semiconductor band-gap energy in the S/D extension regions of the VFET. In solid-state physics, a band gap is typically an energy range in a solid where no electron states can exist. More specifically, a band gap is the energy difference between the top of the valence band and the bottom of the conduction band of the material. If the valence band is completely full and the conduction band is completely empty, electrons cannot move in the solid. However, if some electrons transfer from the valence band to the conduction band, current can flow. Therefore, the size of the band gap is a major factor in determining the electrical conductivity of a solid. Substances with large band gaps are generally insulators, and substances with smaller band gaps are semiconductors. Substances that are conductors have either very small band gaps or none.

According to embodiments of the invention, by creating a decreasing germanium fraction profile across the VFET drain junction according to embodiments of the invention, the GIDL current of the VFET device can be effectively reduced. The anneal temperature and duration can be tuned according to embodiments of the invention until the desired germanium percentage in the fin channel is reached. The anneal temperature and duration can also be tuned according to embodiments of the invention until the desired decreasing germanium doping profile is formed across the VFET drain junction. The anneal temperature and duration can also be tuned according to embodiments of the invention to achieve the desired germanium percentage in the fin channel, as well as the desired decreasing germanium doping profile across the VFET drain junction. In embodiments of the invention, the anneal temperature can range from about 500 to about 1000 degrees Celsius for a duration of from about 10 to about 1000 seconds.

Figure 1A:
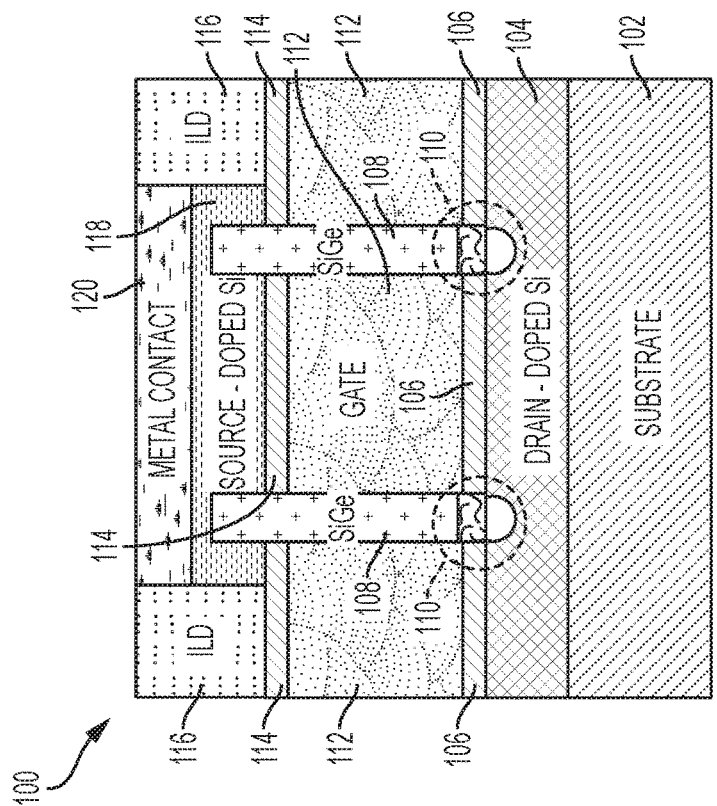
FIG. 1A depicts a cross-sectional view of a VFET structure having a relatively high percentage of germanium in its fin channel, along with a decreasing-gradient doping profile across its drain junction(s) to improve GIDL current performance according to embodiments of the invention.

Turning now to a more detailed description of aspects of the invention, FIG. 1A depicts a cross-sectional view of a VFET structure 100 according to embodiments of the invention. The VFET structure 100 includes a semiconductor substrate 102, a bottom S/D region 104, bottom spacer regions 106, fin channels 108, S/D junction regions 110, gate regions 112, top spacer regions 114, interlayer dielectric (ILD) or cap regions 116, a top S/D region 118, and a contact region 120, configured and arranged as shown. In embodiments of the invention, the semiconductor substrate 102 can be formed from silicon, the bottom S/D region 104 can be formed from doped silicon, the bottom spacer regions 106 can be formed from a dielectric material (e.g., silicon nitride, silicon dioxide, etc.), the channel fins 108 can be formed from silicon germanium, the gate regions 112 can be formed from a metal, the top spacer regions 114 can be formed from a dielectric material, the ILD regions 116 can be formed from an oxide material (e.g., silicon dioxide), the top S/D region 118 can be formed from doped silicon, and the top contact region 120 can be formed from a metal.

FIG. 1B depicts a cross-sectional and isolated view of the channel fin 108, the bottom S/D region 104, and the S/D junction region 110 of the VFET structure 100 shown in FIG. 1B. As shown in FIG. 1B, the channel fin 108 includes an upper channel fin region 108A and a lower channel fin region 108B. As also shown in FIG. 1B, the bottom S/D region 104 includes an upper S/D region 104A and a lower S/D region 104B. A S/D junction 105 is at the intersection between the fin channel 108 and the bottom S/D region 104B. Virtually all semiconductor transistors are based on the formation of junctions such as the S/D junction 105. In general, junctions are capable of both blocking current and allowing it to flow, depending on an applied bias. Junctions are typically formed by placing two semiconductor regions with opposite polarities into contact with one another. The most common junction is the p-n junction, which includes a contact between a p-type piece of silicon, which is rich in holes, and an n-type piece of silicon, which is rich in electrons. N-type and p-type FETs can be formed by implanting different types of dopants to selected regions of the device to form the necessary junction(s). N-type devices can be formed by implanting arsenic (As) or phosphorous (P), and p-type devices can be formed by implanting boron (B).

Figure 12:
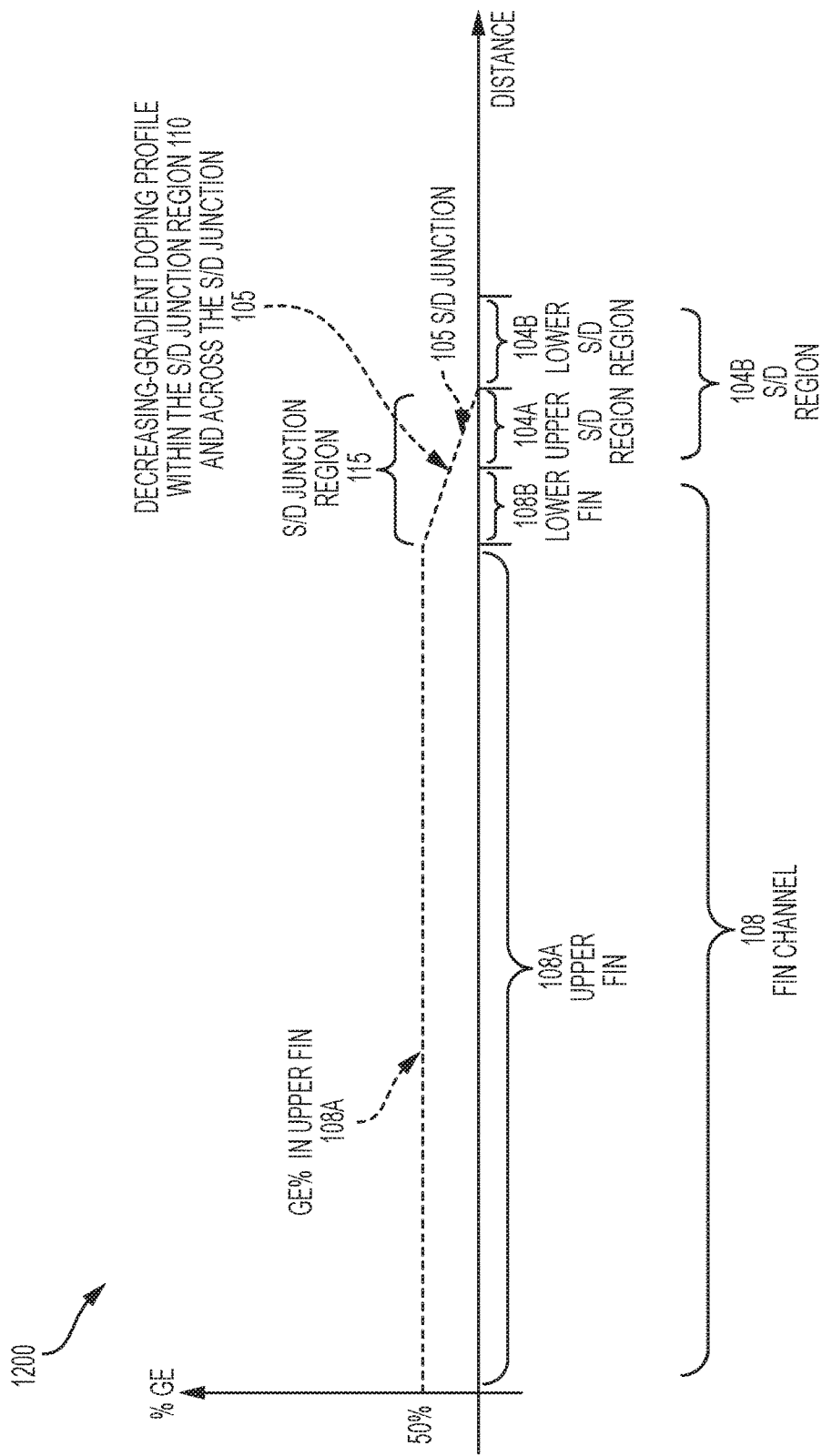
FIG. 12 depicts a graph illustrating an example of a germanium percentage profile along an upper portion of the channel fin, along with an example of a decreasing-gradient germanium percentage profile across a drain junction to improve GIDL current performance according to embodiments of the invention.

The S/D junction region 110 includes the lower channel fin region 108B, the S/D junction 105, and the upper S/D region 104A. The changing cross-hatching (moving from top to bottom) shown in the S/D junction region 110 illustrates that, in accordance with embodiments of the invention, a decreasing-gradient germanium doping profile is provided within the S/D junction region 110 and across the S/D junction 105. According to embodiments of the invention, the decreasing-gradient germanium doping profile in the S/D junction region 110 provides improved GIDL current performance for the VFET structure 100 (shown in FIG. 1A). Additional details about the decreasing-gradient germanium doping profile of the S/D junction region 110 are depicted in FIG. 12 and described subsequently in this detailed description.

According to embodiments of the invention, the channel fins 108 can be formed from a silicon germanium material having a relatively high percentage (e.g., above about 50%) of germanium. The specific germanium percentage chosen determined primarily based on the performance requirements of the VFET structure 100 in the specific application. In general, the use of silicon germanium to form the fin channels 108 can provide desirable device characteristics, including, for example, the introduction of strain in the silicon germanium channels 108 to enhance carrier mobility and thus transistor performance. The compressive strain (typically expressed as a percentage) introduced by using silicon germanium in the active region (e.g., the fin channels 108) of the VFET structure 100 is based on the concentration of germanium introduced into the silicon. For example, a silicon germanium channel fin (e.g., the channel fin 108) having a 25% concentration of germanium can exhibit a nominal compressive strain of 0.01 (or 1%) with a +/−5% variation.

However, without benefit of the present invention, providing a relatively high percentage of germanium in the silicon germanium fins 108 can have a negative impact on the GIDL current performance of the VFET structure 100. This is because, without benefit of the teachings of the present invention, a steep/sharp transition in the germanium percentage would occur from the high germanium percentage fin channel 108 to the low germanium percentage bottom S/D region 104 at the S/D junction 105. This steep/sharp transition would have a negative impact on GIDL current performance, particularly for low $I_{min}$ applications and where the channel fins 108 are formed from a silicon germanium material having a relatively high percentage (e.g., above about 50%) of germanium. By creating a decreasing-gradient germanium doping profile across the S/D junction 105, according to embodiments of the invention, GIDL current performance of the VFET device 100 can be improved, even when a relatively high germanium percentage has been provided in most of the main body of the fin channel 108.

FIGS. 2-11 depict a VFET structure 100A after various fabrication stages according to embodiments of the invention. The VFET structure 100A, after fabrication is completed, will be substantially the same as the VFET structure 100 shown in FIG. 1A.

In FIG. 2, a film stack is formed that includes the semiconductor (e.g., silicon) substrate 102, the bottom S/D region 104 (e.g., doped silicon), a silicon layer 202, and a hardmask (e.g., silicon nitride) layer 204, configured and arranged as shown. The various sections/regions (102, 104, 202, 204) that form the film stack shown in FIG. 2 can be fabricated using a variety of known semiconductor fabrication processes.

The substrate 102 can be any suitable semiconductor substrate material, including, for example, mono-crystalline silicon. In embodiments of the invention, the substrate 102 can include a buried oxide layer (not depicted).

The bottom S/D region 104 can be epitaxially grown and doped through in-situ doping during the epitaxial growth process. The bottom S/D region 104 can be doped through ion implantation after the bottom S/D region 104 has been formed. The bottom S/D region 104 can be doped by any suitable doping techniques, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

The hardmask layer 204 protects the channel fins 302 (shown in FIG. 3) during fabrication thereof. The hardmask layer 204 can be deposited across from the silicon layer 202 using any suitable deposition process. The hardmask layer 204 can be a dielectric such as silicon nitride, silicon oxide, or a combination of silicon oxide and silicon nitride.

In FIG. 3, conventional semiconductor device fabrication processes (e.g., patterning and lithography, self-aligned double patterning, self-aligned quadruple patterning) have been applied to remove portions of the silicon layer 202 and the hardmask layer 204 to form channel fins 302, form the hardmasks 304, and define the S/D junctions 105. In embodiments of the invention, the hardmasks 304 are patterned to expose portions of the silicon layer 202 (shown in FIG. 2). The exposed portions of the silicon layer 202 can then be removed or recessed to form the channel fins 302 using, for example, a wet etch, a dry etch, or a combination thereof.

Figure 4:
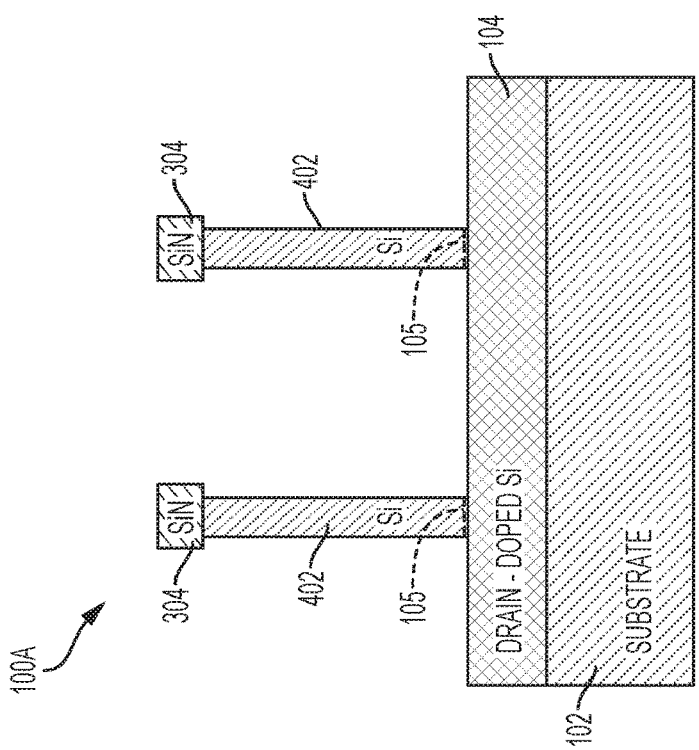
FIG. 4 depicts a cross-sectional view of the semiconductor structure after a fabrication operation according to embodiments of the invention.
Figure 7:
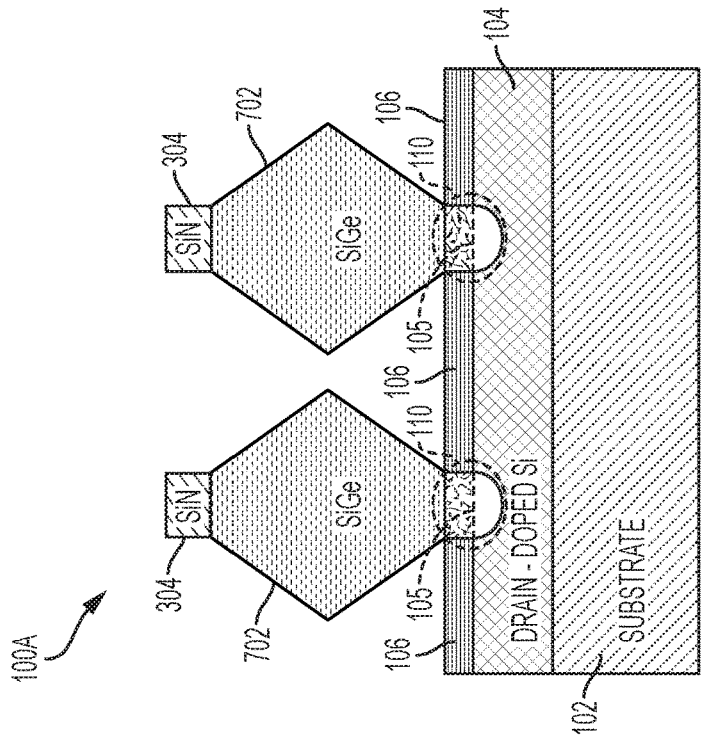
FIG. 7 depicts a cross-sectional view of the semiconductor structure after a fabrication operation according to embodiments of the invention.

In FIG. 4, a width dimension of the channel fins 302 (shown in FIG. 3) has been trimmed to form trimmed channel fins 402. The fin channels 302 can be trimmed using any suitable semiconductor fabrication operation including, for example, applying a conformal dry etch. The trimming operation shown in FIG. 4 is optional. Forming the trimmed channel fins 402 can allow the hardmasks 304 to overhang the trimmed channel fins, thereby providing additional protection during subsequent device fabrication operations. Forming the trimmed channel fins 402 can also reduce the time (and/or temperature) required in order to drive germanium through the trimmed channel fins 402 to form the silicon germanium channel fins 108 (shown in FIG. 1A) and reach the desired germanium percentage in the channel fins 108. A process, according to embodiments of the invention, for driving germanium through the trimmed channel fins 402 to form the silicon germanium channel fins 108 is shown in FIGS. 6 and 7 and will be described in greater detail below.

Figure 5:
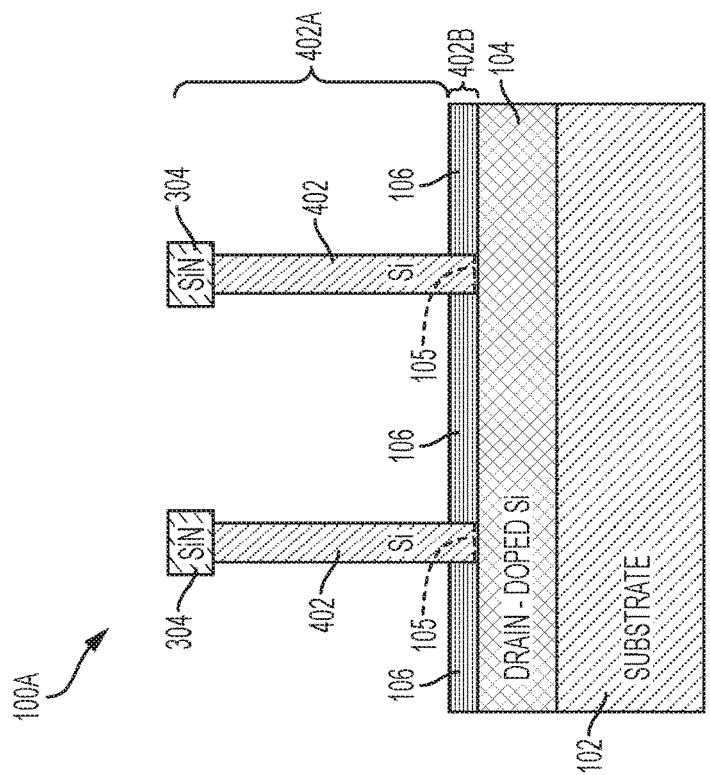
FIG. 5 depicts a cross-sectional view of the semiconductor structure after a fabrication operation according to embodiments of the invention.

In FIG. 5, the bottom spacer regions 106 are deposited over the bottom S/D region 104 using any suitable deposition process. The bottom spacer regions 106 can be formed from a dielectric material (e.g., silicon nitride, silicon dioxide, etc.). The bottom spacer regions 106 electrically isolate the trimmed channel fins 402 from the bottom S/D region 104. Additionally, a height dimension of the bottom spacer regions 106 directly defines the height dimension of an upper channel fin regions 402A, and indirectly defines the height dimension of the lower channel fin regions 402B. The upper channel fin regions 402A correspond to the upper channel fin regions 108A (shown in FIG. 1B), and the lower channel fin regions 402B correspond to the lower channel fin regions 108B (shown in FIG. 1B).

Figure 6:
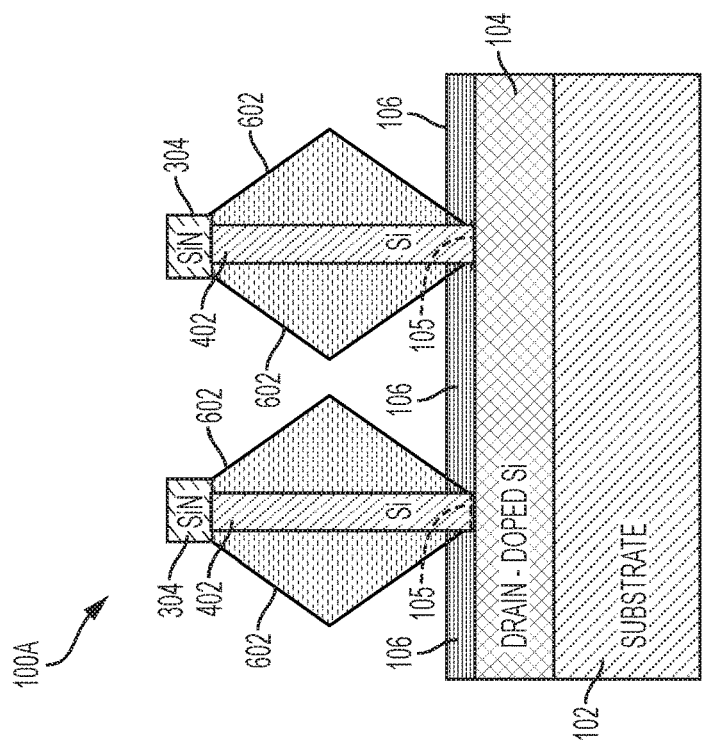
FIG. 6 depicts a cross-sectional view of the semiconductor structure after a fabrication operation according to embodiments of the invention.

In FIG. 6, diamond-shaped silicon germanium regions 602 have been deposited along the exposed sidewalls in the upper channel fin regions 108A of the trimmed channel fins 402. In embodiments of the invention, the diamond-shaped silicon germanium regions 602 can be deposited using epitaxial growth techniques. The diamond-shaped silicon germanium regions 602 can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ $cm^{-3}$ to $2\times10^{21}$ $cm^{-3}$, or preferably between $2\times10^{20}$ $cm^{-3}$ and $1\times10^{21}$ $cm^{-3}$.

The terms "epitaxial growth and/or deposition" and "epitaxially formed and/or grown" mean the growth of a semiconductor material (crystalline material) on a deposition surface of another semiconductor material (crystalline material) in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a <100> orientated crystalline surface will take on a <100> orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In FIG. 7, a thermal anneal operation has been applied in order to intermix the silicon germanium of the silicon germanium regions 602 (shown in FIG. 6) with the silicon of the trimmed channel fins 402 (shown in FIG. 6) to form post-anneal diamond-shaped silicon germanium regions 702. The thermal anneal, in effect, drives germanium substantially laterally from the silicon germanium regions 602 through the trimmed channel fins 402 (specifically, through the upper trimmed channel fins 402A shown in FIG. 5) until the desired germanium percentage has been reached throughout the post-anneal diamond-shaped silicon germanium regions 702. The germanium percentage throughout the post-anneal diamond-shaped silicon germanium regions 702 can be selected based on a number of variables, including, for example, the initial germanium percentage selected for the silicon germanium regions 602, the height (vertical) and width (lateral) dimensions of the silicon germanium regions 602, the width dimension of the trimmed channel fins 402, the temperature of the anneal, and the duration of the anneal. These variables, along with others known to those skilled in the art, can be selected and manipulated in order to achieve the desired germanium percentage in the post-anneal diamond-shaped silicon germanium regions 702, which can, in some embodiments of the invention, be a relatively high germanium percentage (e.g., above about 50%). In fabrication operations described in greater detail subsequently herein, the channel fins 108 (shown in FIG. 1A) will be formed from post-anneal diamond-shaped silicon germanium regions 702.

As also shown in FIG. 7, in addition to driving germanium substantially laterally from the silicon germanium regions 602 (shown in FIG. 6) into the upper trimmed channel fins 402A (shown in FIG. 5), the anneal operation also results in germanium diffusing into the lower fin regions 402B (shown in FIG. 5) to create a decreasing-gradient germanium doping profile in the S/D junction region 110. The changing cross-hatching (moving from top to bottom of the figure) shown in the S/D junction region 110 illustrates that, in accordance with embodiments of the invention, a decreasing-gradient germanium doping profile is provided within the S/D junction region 110 and across the S/D junction 105. According to embodiments of the invention, the decreasing-gradient germanium doping profile in the S/D junction region 110 provides improved GIDL current performance for the VFET structure 100A (and VFET structure 100 shown in FIG. 1A). Additional details about the decreasing-gradient germanium doping profile of the S/D junction region 110 are depicted in FIG. 12 and described subsequently in this detailed description.

In FIG. 8, conventional semiconductor device fabrication processes (e.g., patterning and lithography, self-aligned double patterning, self-aligned quadruple patterning) have been applied to remove portions of post-anneal diamond-shaped silicon germanium regions 702 (shown in FIG. 7) not covered by the hardmasks 304, thereby forming the upper channel fin regions 108A of the channel fins 108. In some embodiments of the invention, the upper channel fin regions 108A of the channel fins 108 include a relatively high germanium percentage (e.g., above about 50%). The exposed portions of post-anneal diamond-shaped silicon germanium regions 702 can be removed or recessed using, for example, a wet etch, a dry etch, or a combination thereof.

In FIG. 9, the gate regions 112 have been deposited over the bottom spacer regions 106 and adjacent to the upper channel fin regions 108A of the channel fins 108. In embodiments of the invention, the gate regions 112 can be formed by overfilling the gate material above a top surface of the hardmasks 304, planarizing the gate material to substantially the same level as the top surface of the hardmasks 304 using, for example, chemical mechanical polishing (CMP) techniques, and then recessed to the level depicted in FIG. 9. The gate regions 112 can be recessed using any suitable process, such as, for example, a wet etch, a dry etch, or a combination thereof.

Also in FIG. 9, the top spacer regions 114 have been directionally deposited over the gate regions 112 using any suitable deposition process. The top spacer regions 114 can be formed from a dielectric material (e.g., silicon nitride, silicon dioxide, etc.).

In FIG. 10, the ILD regions 116 have been formed over the gate regions 112 using any suitable deposition process. For example, the ILD material can be deposited in bulk over the gate region 112, and then patterned and etched to open a region 1002 for receiving the top S/D region 118 (shown in FIG. 11) and the contact region 120 (shown in FIG. 11). The ILD regions 116 can be formed from an oxide material such as silicon dioxide.

In FIG. 11, the hardmasks 304 have been removed, and the top S/D region 118 has been formed using any suitable deposition process. The top S/D region 118 can be epitaxially grown and doped through in-situ doping during the epitaxial growth process. The top S/D region 118 can be doped through ion implantation after the top S/D region 118 has been formed. The top S/D region 118 can be doped by any suitable doping techniques, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

The contact region 120 (shown in FIG. 1A) can be formed in ohmic contact with the top S/D regions 118 using known metallization techniques. In embodiments of the invention, the contact region 120 is overfilled into the region 1002 (shown in FIG. 10), thereby forming an overburden above a surface of the ILD regions 116. CMP can be used to remove the overburden.

The contact region 120 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials.

In embodiments of the invention, the contact region 120 can include a metal (e.g., titanium) that reacts with semiconductor materials (e.g., the top S/D region 118) to form a silicide film (not depicted) between the top S/D region 118 and the contact region 120. Because the silicide film is only formed at the interface between the contact region 120 and the top S/D region 118, the silicide film can be said to be self-aligned to the top S/D region 118.

FIG. 12 depicts a graph 1200 that plots an example of a germanium (Ge) percentage vs distance profile that can be achieved through the channel fin 108 and the S/D region 104 utilizing the above-described embodiments of the invention. The vertical axis shows the germanium percentage (Ge %) that extends through the fin channels 108 and the S/D region 104, and horizontal axis, moving from left to right along the horizontal axis, shows the distance measured from the top of the channel fin 108 to the bottom of the S/D region 104. The graph 1200 is for illustration purposes and is not drawn to scale. Also the Ge % is shown as a straight line for ease of illustration. In practice, the Ge % may or may not be a straight line, depending on the specifics of the application. In the illustrated example, the Ge % throughout the upper channel fin 108A is about 50%. From the start of the lower channel fin 108B through the upper S/D region 104, the Ge % decreases from 50% to approximately 0% according to the decreasing-gradient doping profile.

The parameters of the decreasing-gradient doping profile shown in FIG. 12 are selected to provide a desired slope or rate of descent of the Ge % in the decreasing-gradient doping profile. The parameters are selected by selecting a number of variables, including, for example, the initial germanium percentage selected for the silicon germanium regions 602, the height (vertical) and width (lateral) dimensions of the silicon germanium regions 602, the width dimension of the trimmed channel fins 402, the temperature of the anneal, and the duration of the anneal. These variables, along with others known to those skilled in the art, can be selected and manipulated in order to achieve the desired slope or rate of descent of the Ge % in the decreasing-gradient doping profile. In the example shown in FIG. 12, the slope or rate of descent of the decreasing-gradient doping profile is selected such that the Ge % in the S/D junction region 110 has fallen to approximately 0% just prior to the end of the upper S/D region 104A.

Figure 13:
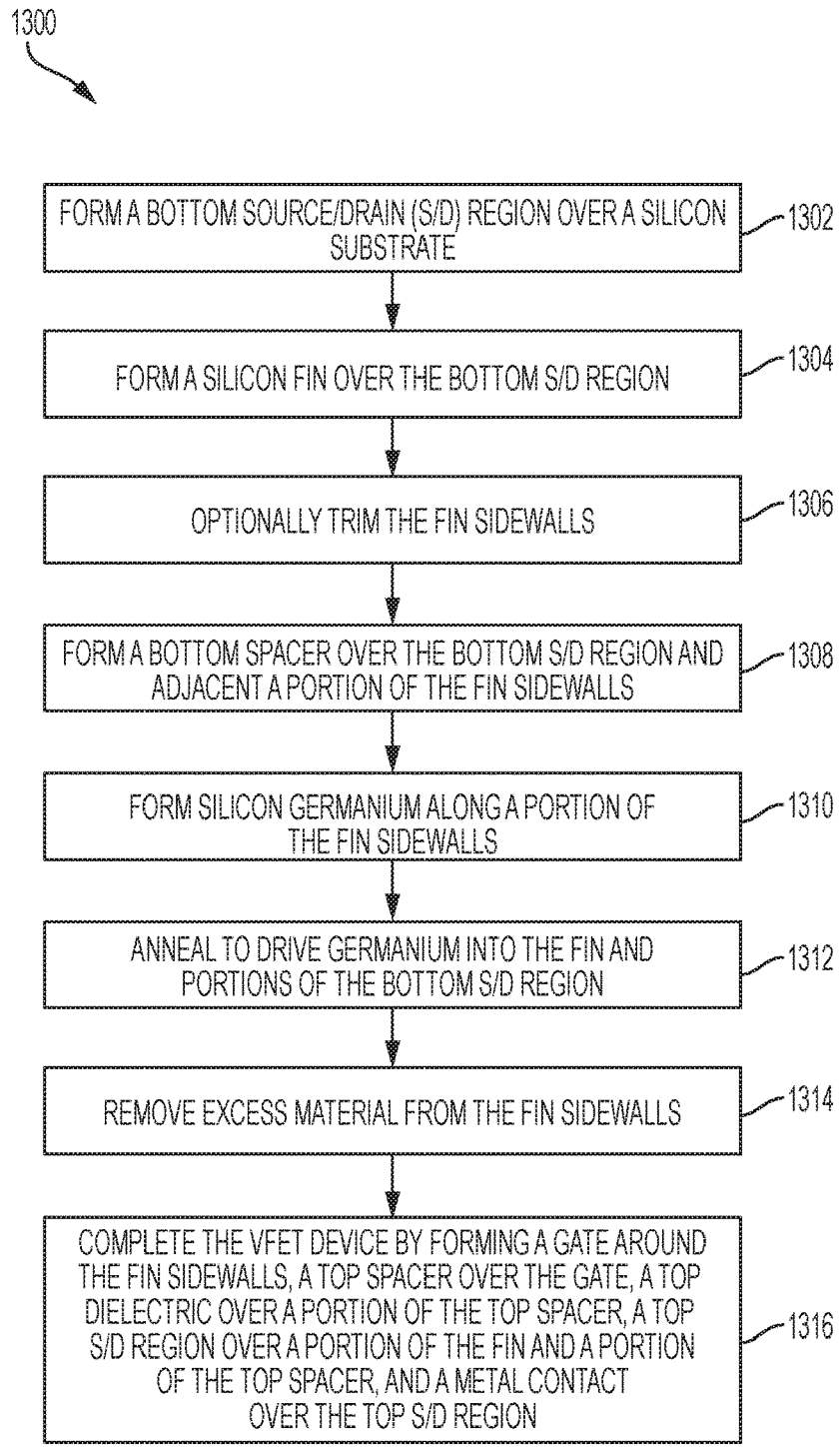
FIG. 13 depicts a flow diagram illustrating a fabrication methodology according to one or more embodiments of the invention.

FIG. 13 depicts a flow diagram illustrating a fabrication methodology 1300 according to embodiments of the invention. At block 1302 of the methodology 1300, a bottom doped S/D region is formed over a silicon substrate. At block 1304 a silicon fin is formed over the bottom S/D region. At block 1306, the silicon fin's sidewalls can be optionally trimmed. At block 1308, a bottom spacer is formed over the bottom S/D region and adjacent a portion of the fin sidewalls. At block 1310, silicon germanium regions are formed (e.g., through epitaxy) along a portion of the fin sidewall. At block 1312 an anneal operation is applied to drive germanium from the silicon germanium regions into the fin and portions of the bottom S/D region. At block 1314, excess post-anneal silicon germanium is removed to form fins having the desired percentage of germanium. At block 1316, the VFET device is completed by forming a gate around the fin sidewalls, a stop spacer over the gate, a stop dielectric over a portion of the top spacer, a top S/D region over a portion of the fin and apportion of the top spacer, and a metal contact over the top S/D region.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a fin channel over a bottom source-or-drain (S/D) region;
   wherein the fin channel comprises an upper fin channel region and a lower fin channel region;
   wherein the bottom S/D region comprises an upper S/D region and a lower S/D region;
   forming a S/D junction at an interface between the lower fin channel region and the upper S/D region; and
   applying a doping process configured to drive a first type of dopant into the upper fin channel region;
   wherein the doping process also diffuses the first type of dopants into the lower fin channel region, across the S/D junction, and into the upper S/D region.

2. The method of claim 1, wherein the doping process comprises forming an epitaxially grown semiconductor material on a sidewall of the upper fin channel region.

3. The method of claim 2, wherein the epitaxially grown semiconductor material comprises a selected percentage of the first type of dopant.

4. The method of claim 3, wherein the doping process further comprises subjecting the epitaxially grown semiconductor material and the upper fin channel region to an anneal operation.

5. The method of claim 4, wherein a duration and a temperature of the anneal operation are sufficient to drive the first type of dopant from the epitaxially grown semiconductor material into the upper fin channel region.

6. The method of claim 5, wherein the duration and the temperature of the anneal operation are sufficient to achieve a selected percentage of the first type of semiconductor material in the upper fin channel region.

7. The method of claim 4, wherein a duration and a temperature of the anneal operation are sufficient to cause the first type of dopant to diffuse from the upper fin channel region into the lower fin channel region, across the S/D junction, and into the upper S/D region.

8. The method of claim 7, wherein a percentage of the first type of dopant in the upper S/D region is less than a percentage of the first type of dopant in the lower fin channel region.

9. The method of claim 1, wherein:
the upper channel fin comprises silicon; and
the first type of dopant comprises germanium.

10. A semiconductor device comprising:
a fin channel formed over a bottom source-or-drain (S/D) region;
wherein the fin channel comprises an upper fin channel region and a lower fin channel region;
wherein the bottom S/D region comprises an upper S/D region and a lower S/D region; and
a S/D junction formed at an interface between the lower fin channel region and the upper S/D region;
wherein the upper fin channel region comprises a first type of dopant;
wherein the lower fin channel region comprises the first type of dopant;
wherein the upper S/D region comprises the first type of dopant;
wherein a percentage of the first type of dopant in the upper fin channel region is greater than a percentage of the first type of dopant in the upper S/D region.

11. The semiconductor device of claim 10, wherein a percentage of the first type of dopant in the upper fin channel region is greater than a percentage of the first type of dopant in the lower fin channel region.

12. The semiconductor device of claim 11, wherein a percentage of the first type of dopant in the upper S/D region is less than the percentage of the first type of dopant in the lower fin channel region.

13. The semiconductor device of claim 12, wherein:
the channel fin comprises silicon; and
the first type of dopant comprises germanium.

* * * * *